(12) United States Patent
Hwang et al.

(10) Patent No.: US 12,322,768 B2
(45) Date of Patent: Jun. 3, 2025

(54) SYSTEM AND METHOD FOR DETECTING A DEFECTIVE BATTERY USING WIRELESS COMMUNICATIONS

(71) Applicant: LG Energy Solution, Ltd., Seoul (KR)

(72) Inventors: Ji Won Hwang, Daejeon (KR); Hyun Ki Cho, Daejeon (KR); Sang Hoon Lee, Daejeon (KR); Jae Dong Park, Daejeon (KR); Hu Jun Lee, Daejeon (KR); Jung Hyun Kwon, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 449 days.

(21) Appl. No.: 17/789,270

(22) PCT Filed: May 27, 2021

(86) PCT No.: PCT/KR2021/006618
§ 371 (c)(1),
(2) Date: Jun. 27, 2022

(87) PCT Pub. No.: WO2021/256721
PCT Pub. Date: Dec. 23, 2021

(65) Prior Publication Data
US 2023/0053008 A1  Feb. 16, 2023

(30) Foreign Application Priority Data
Jun. 15, 2020 (KR) .................. 10-2020-0072624

(51) Int. Cl.
*H01M 10/48* (2006.01)
*G01R 31/392* (2019.01)
(Continued)

(52) U.S. Cl.
CPC ........ *H01M 10/482* (2013.01); *G01R 31/392* (2019.01); *H01M 10/425* (2013.01); *H01M 2010/4278* (2013.01); *H04L 67/12* (2013.01)

(58) Field of Classification Search
None
See application file for complete search history.

(56) References Cited

U.S. PATENT DOCUMENTS

| 8,793,087 B2 | 7/2014 | Librizzi |
| 2011/0050236 A1 | 3/2011 | Sekizaki et al. |

(Continued)

FOREIGN PATENT DOCUMENTS

| CN | 103337882 A | 10/2013 |
| JP | 2007333393 A | 12/2007 |

(Continued)

OTHER PUBLICATIONS

International Search Report for Application No. PCT/KR2021/006618 mailed Sep. 17, 2021, pp. 1-3.

(Continued)

*Primary Examiner* — Jas A Sanghera
(74) *Attorney, Agent, or Firm* — Lerner David LLP

(57) ABSTRACT

A system for detecting a defective battery using wireless communications. The system includes first sensors and a first master device. The first sensors are matched on a 1:1 basis with first battery modules to monitor the first battery modules. The first master device communicates with the first sensors. The respective first sensors each include a first monitoring circuit which collects a primary data on a 1:1-matched first battery module in a monitoring mode, and a first communicating circuit which outputs the primary data to the first master device in a communicating mode. The first (Continued)

monitoring circuit is turned off in the communicating mode. The first communicating circuit is turned off in the monitoring mode.

13 Claims, 6 Drawing Sheets

(51) Int. Cl.
*H01M 10/42* (2006.01)
*H04L 67/12* (2022.01)

(56) References Cited

U.S. PATENT DOCUMENTS

| | | |
|---|---|---|
| 2013/0099793 A1 | 4/2013 | Shimizu |
| 2013/0271072 A1 | 10/2013 | Lee et al. |
| 2015/0054467 A1 | 2/2015 | Takano et al. |
| 2015/0132615 A1 | 5/2015 | Yun |
| 2018/0183252 A1 | 6/2018 | Kim et al. |
| 2018/0372804 A1 | 12/2018 | Yamazaki et al. |
| 2019/0033377 A1 | 1/2019 | Karner et al. |
| 2019/0033381 A1 | 1/2019 | Karner et al. |
| 2019/0033382 A1 | 1/2019 | Karner et al. |
| 2019/0033383 A1 | 1/2019 | Karner et al. |
| 2019/0033384 A1 | 1/2019 | Karner et al. |
| 2019/0033385 A1 | 1/2019 | Karner et al. |
| 2019/0033388 A1 | 1/2019 | Karner et al. |
| 2019/0033393 A1 | 1/2019 | Karner et al. |
| 2019/0033394 A1 | 1/2019 | Karner et al. |
| 2019/0033395 A1 | 1/2019 | Karner et al. |
| 2019/0033396 A1 | 1/2019 | Karner et al. |
| 2019/0033397 A1 | 1/2019 | Karner et al. |
| 2019/0035237 A1 | 1/2019 | Karner et al. |
| 2019/0036178 A1 | 1/2019 | Karner et al. |
| 2019/0094311 A1 | 3/2019 | Yamada |
| 2019/0229376 A1 | 7/2019 | Petrakivskyi et al. |
| 2019/0252735 A1 | 8/2019 | Sung et al. |
| 2019/0265304 A1 | 8/2019 | Kim et al. |
| 2019/0356143 A1 | 11/2019 | Lee et al. |
| 2020/0106278 A1 | 4/2020 | Sung et al. |
| 2020/0233658 A1 | 7/2020 | Yang et al. |
| 2020/0242436 A1 | 7/2020 | Yang et al. |
| 2020/0295408 A1 | 9/2020 | Yang et al. |
| 2020/0301696 A1 | 9/2020 | Yang et al. |
| 2021/0184270 A1 | 6/2021 | Sung et al. |
| 2021/0286612 A1 | 9/2021 | Yang et al. |
| 2021/0410222 A1* | 12/2021 | Numata ............... H01M 10/482 |
| 2023/0127497 A1 | 4/2023 | Yang et al. |
| 2023/0198030 A1 | 6/2023 | Sung et al. |

FOREIGN PATENT DOCUMENTS

| | | |
|---|---|---|
| JP | 4827624 B2 | 11/2011 |
| JP | 2013140055 A | 7/2013 |
| JP | 2013207901 A | 10/2013 |
| JP | 5503924 B2 | 5/2014 |
| JP | 2017174587 A | 9/2017 |
| JP | 2017215276 A | 12/2017 |
| JP | 2019007837 A | 1/2019 |
| JP | 6514694 B2 | 5/2019 |
| JP | 2019536215 A | 12/2019 |
| KR | 101423961 B1 | 7/2014 |
| KR | 101457436 B1 | 11/2014 |
| KR | 20180074301 A | 7/2018 |
| KR | 20190005407 A | 1/2019 |
| KR | 20190010032 A | 1/2019 |
| KR | 20190011568 A | 2/2019 |
| KR | 101977748 B1 | 5/2019 |
| KR | 20190060389 A | 6/2019 |
| KR | 20190089401 A | 7/2019 |
| KR | 20200024944 A | 3/2020 |
| KR | 20200038267 A | 4/2020 |
| WO | 2019009535 A1 | 1/2019 |
| WO | 2019120292 A1 | 6/2019 |

OTHER PUBLICATIONS

Extended European Search Report for Application No. 21827061.9 dated Jul. 10, 2023 . . . 8 pgs.

* cited by examiner

SYSTEM AND METHOD FOR DETECTING A DEFECTIVE BATTERY USING WIRELESS COMMUNICATIONS

CROSS-REFERENCE TO RELATED APPLICATIONS

The present application is a national phase entry under 35 U.S.C. § 371 of International Application No. PCT/KR2021/006618 filed May 27, 2021, which claims priority from Korean Patent Application No. 10-2020-0072624 filed on Jun. 15, 2020, all of which are hereby incorporated by reference.

TECHNICAL FIELD

The present invention relates to a system for detecting a defective battery. More specifically, the present invention relates to a system and method for detecting a defective battery module after a manufacturing step.

BACKGROUND ART

In recent years, there has been active research and development into secondary batteries. Here, a secondary battery is a battery capable of charging and discharging, and includes all of conventional Ni/Cd batteries, Ni/MH batteries, etc., and the more recent lithium ion batteries. Among secondary batteries, lithium ion batteries have an advantage in that they have much higher energy density compared to conventional Ni/Cd batteries and Ni/MH batteries, etc. Lithium ion batteries can be made with light weight and a small form factor, and are used as electrical power sources for mobile devices. In particular, lithium ion batteries can be used as an electrical power source for electric vehicles, and are receiving attention as a next-generation energy storage medium.

Secondary batteries are generally use in battery module units where in a plurality of battery cells are connected serially and/or in parallel. After the manufacturing step, battery modules are stored and monitored on a pallet. Through monitoring, defective battery modules are sorted out from among the battery modules, and the longer the monitoring period, the higher the sorting accuracy becomes. However, conventionally, due to the problem of power requirements and cost increasing with monitoring period, battery modules could only be monitored for a short period. Further, according to conventional methods, there was a problem that the position of (a) defective battery module(s) among the multiplicity of battery modules on a pallet was difficult to ascertain.

SUMMARY

Technical Problem

The purpose of the present invention, which has been devised to solve the above-stated technical problem, is to provide a system and method for detecting a defective battery using wireless communication.

Technical Solution

The system for detecting a defective battery according to one embodiment of the present invention may be comprised of a plurality of first sensors, each first sensor configured to monitor a corresponding one of a plurality first battery modules; and a first master device configured to communicate with the plurality of first sensors, each first sensor comprising: a monitoring circuit configured to collect primary data from the corresponding first battery module in a monitoring mode; and a communicating circuit configured to output the primary data to the first master device in a communicating mode. The first monitoring circuit may be turned off in the communicating mode. The first communicating circuit may be turned off in the monitoring mode.

The method for detecting a defective battery according to one embodiment of the present invention may be comprised of: collecting, by a plurality of first monitoring circuits of first sensors, primary data from each of a plurality of first battery modules corresponding to the first sensors in a one-to-one correspondence; collecting, by a plurality of second monitoring circuits of second sensors, secondary data from each of a plurality of second battery modules corresponding to the second sensors in a one-to-one correspondence; outputting, by a first master device in communication with first communicating circuits of the first sensors, the primary data to a server; outputting, by a second master device in communication with second communicating circuits of the second sensors, the secondary data to the server; and identifying, by the server, one or more suspect battery modules suspected to be defective from among the first battery modules and the second battery modules based on the primary data and the secondary data. During the collecting, a driving power signal input into the respective first communicating circuits and the second communicating circuits may be cut off. During the outputting, a driving power signal input into the respective first monitoring circuits and the second monitoring circuits may be cut off.

Advantageous Effects

The present invention, by using sensors, a master device and a server, is capable of broad management of battery modules, and is able to more accurately and conveniently ascertain the position of a defective battery module. Further, the sensors of the present invention, by turning off some circuits depending on an operating mode, can reduce the electrical power required for monitoring battery modules.

DETAILED DESCRIPTION

Figure 1:
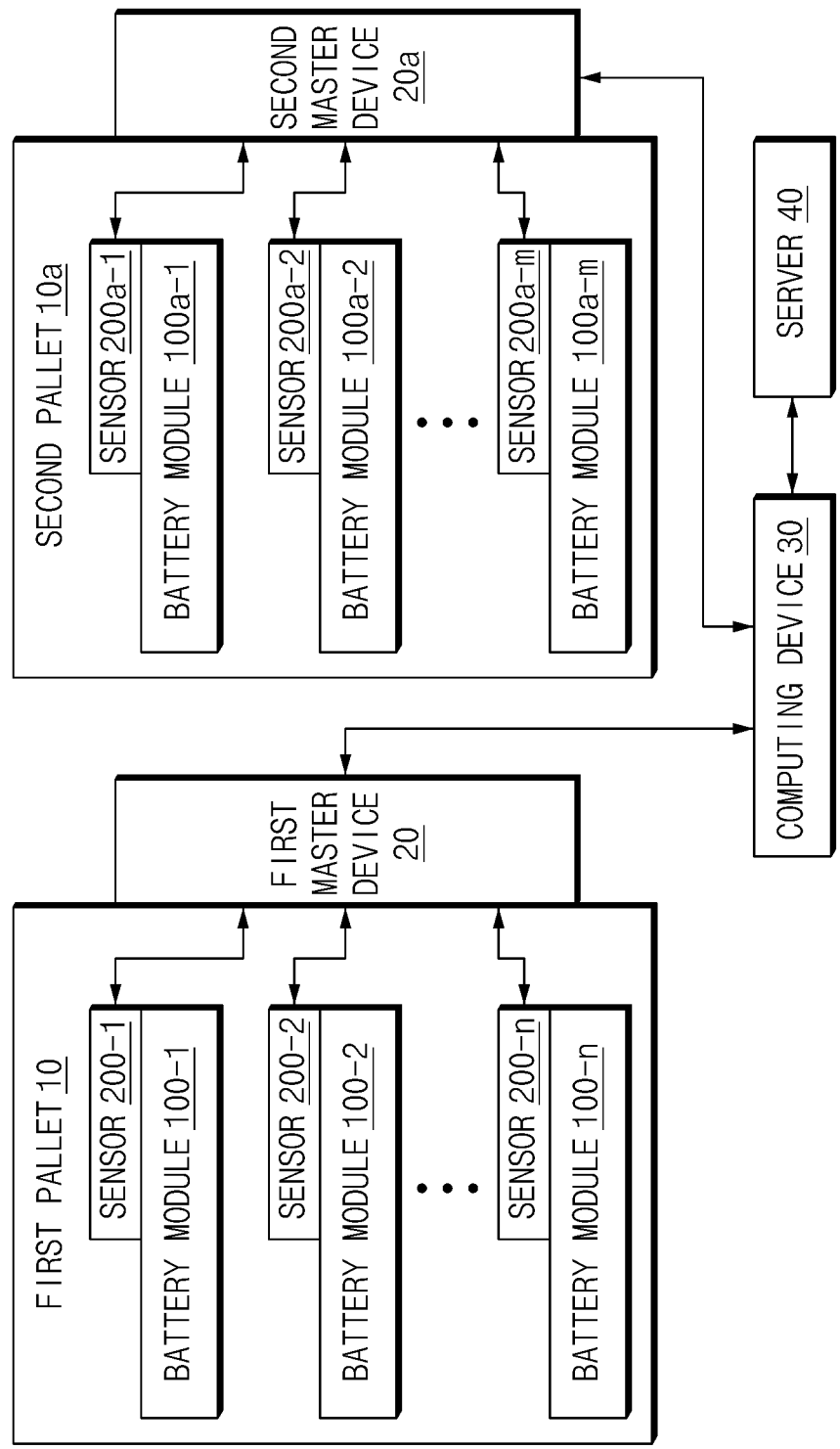
FIG. 1 is a block diagram illustrating the system for detecting a defective battery according to the present invention.

In the following, various embodiments of the present invention will be described in detail with reference to the attached drawings. In the present document, like reference signs are used to refer to like elements in the drawings, and redundant description of like elements will be omitted.

With regard to the various embodiments of the present invention disclosed in the present document, specific structural or functional descriptions are exemplified solely for the purpose of describing embodiments of the present invention. The various embodiments of the present invention may be carried out in various forms, and shall not be interpreted as being limited to the embodiments described in the present document.

Expressions such as "first" or "second" used in the various embodiments may describe various component elements without regard for order and/or importance, and do not limit such component elements. For example, without departing from the scope of the present invention, a first component element may be designated as a second component element, and similarly a second component element may also instead be designated as a first component element.

The terms used in the present invention are used only to describe specific embodiments, and may not be intended to limit the scope of other embodiments. Singular expressions, unless clearly intended otherwise by context, may also include plural expressions.

Including technical or scientific terms, all terms used herein may have the same meaning as that generally understood by a person having ordinary skill in the technical field of the present invention. Generally used, dictionary-defined terms may be interpreted as having identical or similar meaning as that which they have in the context of the relevant art, and unless clearly so defined in the present document, shall not be interpreted as having ideal or inordinately formal meanings. In no case may terms defined in the present document be interpreted in a manner that excludes the embodiments of the present invention.

FIG. 1 is a block diagram illustrating the system for detecting a defective battery according to the present invention.

The system for detecting a defective battery 1 may be comprised of n number of battery modules 100-1~100-$n$, n number of sensors 200-1~200-$n$, a first master device 20, m number of battery modules 100$a$-1~100$a$-$m$, m number of sensors 200$a$-1~200$a$-$m$, a second master device 20$a$, a computing device 30 and a server 40. The n number of battery modules 100-1~100-$n$, may after being manufactured, be stored on a first pallet 10, or be transported on the first pallet 10. The m number of battery modules 100$a$-1~100$a$-$m$ may also, after being manufactured, be stored on a second pallet 10$a$, or be transported on the second pallet 10$a$. 'n' and 'm' are natural numbers.

From after the battery modules 100-1~100-$n$ and battery modules 100$a$-1~100$a$-$m$ are manufactured until they are released, the system for detecting a defective battery 1 may monitor the battery modules 100-1~100-$n$ and battery modules 100$a$-1~100$a$-$m$ and sort out defective battery modules. Here, the period from after the battery modules have been manufactured until they are released may be a period during which the battery modules are stored on a pallet. In the following descriptions, a defective battery module refers to a battery module whose open circuit voltage (OCV) is lower than a reference voltage. The reference voltage may be a voltage established based on the voltage of a battery module immediately after manufacture and a typical self-discharge rate of a battery module. Further, the reference voltage may be a value established by a user, or may be a value established according to experimental results.

The battery modules 100-1~100-$n$ and sensors 200-1~200-$n$ may be stored on a first pallet 10. The respective battery modules 100-1~100-$n$ may be comprised of battery cells connected serially or in parallel. The sensors 200-1~200-$n$ may respectively be matched with the battery modules 100-1~100-$n$ on a 1:1 basis. The respective sensors 200-1~200-$n$ may each be attached to a 1:1-matched battery module to monitor the 1:1-matched battery module. For example, in a case where a sensor 200-1 is 1:1-matched with a battery module 100-1, the sensor 200-1 may be attached to the battery module 100-1 to monitor the battery module 100-1.

In the following description, for convenience of description, the description will focus on actions carried out between the sensor 200-1 and the battery module 100-1. The actions carried out between the remaining sensors 200-2~200-$n$, 200$a$-1~200$a$-$m$ and the remaining battery modules 100-2~100-$n$, 100$a$-1~100$a$-$m$ correspond to the actions carried out between the sensor 200-1 and the battery module 100-1.

In a monitoring mode, the sensor 200-1 may collect a primary data relating to a status of the battery module 100-1. Specifically, the sensor 200-1 may measure voltage at both terminals of the battery module 100-1. The primary data may include information on the voltage at both terminals of the battery module 100-1. The voltage at both terminals of the battery module 100-1 may mean the sum total of the voltages of all of the battery cells included in the battery module 100-1. However, the present invention is not limited hereto, and the primary data may include information on the voltage, current and temperature, etc. of the battery module 100-1.

In a communicating mode, the sensor 200-1 may communicate with a first master device 20. Specifically, the sensor 200-1 may output a primary data collected in a monitoring mode to a first master device 20. Further, in a case where the battery module 100-1 is a defective battery module, the sensor 200-1 may receive a notification signal from the first master device 20.

The sensor 200-1 may include a monitoring circuit and a communicating circuit. The sensor 200-1 may, in a monitoring mode, use a monitoring circuit to collect a primary data relating to the battery module 100-1. The sensor 200-1 may, in a communicating mode, use a communicating circuit to communicate with a first master device 20. The sensor 200-1 may, in a monitoring mode, turn-on the monitoring circuit, and turn-off the communicating circuit. The sensor 200-1 may, in a communicating mode, turn-on the communicating circuit, and turn-off the monitoring circuit. The sensor 200-1, through such operation, reduce the electrical power consumed in monitoring the battery module 100-1. In the following description, to turn-off a circuit means to cut off a driving power which is input into the circuit, and to turn-on a circuit means to input a driving power into the circuit.

In a communicating mode, the sensors 200-1~200-$n$ may output a primary data relating to the battery modules 100-1~100-$n$ to a first master device 20. The sensors 200$a$-1~200$a$-$m$ may output a secondary data relating to the battery modules 100$a$-1~100$a$-$m$ to a second master device 20$a$. The secondary data may include information on the voltages of the battery modules 100$a$-1~100$a$-$m$. The first master device 20 and the second master device 20$a$ may be matched on a 1:1 basis with a first pallet 10 and a second pallet 10$a$. The first master device 20 and the second master device 20$a$ may be attached to the respective 1:1-matched pallets, and may communicate with sensors included in the 1:1-matched pallets. The sensors 200-1~200-$n$ and sensors 200$a$-1~200$a$-$m$ may communicate by wire and/or wirelessly with the first master device 20 and the second master device 20a, respectively, using a communication protocol. The wired communication protocol may be I2C (inter integrated circuit) interface, SPI (serial peripheral interface), RS-232, RS-422, RS-485, Ethernet, CAN (controller area network), CANFD (flexible data rate), LIN (local interconnect network), FlexRay, DeviceNet, Fieldbus, ieee1394 (firewire), or USB (universal serial bus) and the like. As the wireless communication technology, WLAN (Wireless LAN)(Wi-Fi), Wibro (Wireless broadband), Wimax (World Interoperability for Microwave Access), WCDMA (Wideband Code Division Multiple Access), HSDPA (High Speed Downlink Packet Access), or LTE (Long Term Evolution) and the like may be used. Further, as short range communication technology, Bluetooth, RFID (Radio Frequency Identification), infrared communication (IrDA, Infrared Data Association), UWB (Ultra-Wideband), or ZigBee and the like may be used.

The first master device 20 may output the primary data received from the sensors 200-1~200-n to a computing device 30. The second master device 20a may output the secondary data received from the sensors 200a-1~200a-m to the computing device 30. The computing device 30 may be one of a desktop, a laptop, a smartphone, a smart pad, a tablet PC, or the like.

The computing device 30 may output the primary data and the secondary data to a server 40. The server 40 may be a device capable of storing and processing more data than the computing device 30. The server 40 may, based on the primary data and the secondary data, sort out suspect battery modules from among the battery modules 100-1~100-n, 100a-1~100a-m. The server 40 may, using a method of sorting out a battery module having a lower voltage than a reference voltage level, sort out suspect battery modules suspected to be defective. Referring to FIG. 1, the server 40 is explained as receiving data on the battery modules 100-1~100-n, 100a-1~100a-m once, then sorting out suspect battery modules, but the present invention is not limited hereto. The server 40 may also receive data on the battery modules 100-1~100-n, 100a-1~100a-m multiple times, then aggregate the data to sort out suspect battery modules.

After sorting out suspect battery modules, the server 40 may output a first notification signal to a computing device 30. The first notification signal may include information on the suspect battery module. The computing device 30 may output the first notification signal to a master device corresponding to the pallet including the suspect battery module. In the following description, the suspect battery module is assumed to be battery module 100-1. Accordingly, the computing device 30 is able to transmit the first notification signal to the first master device 20.

Based on the first notification signal, the first master device 20 may output a second notification signal to a sensor 200-1 corresponding to the battery module 100-1. In a case where the second notification signal is received, the sensor 200-1 may switch operating modes. In a case where the second notification signal is received, the sensor 200-1 may operate in an alarm mode. In an alarm mode, the sensor 200-1 may output a detection signal including position data of the battery module 100-1 to the first master device 20. For example, the detection signal may indicate an ID (identification) of the battery module 100-1. The first master device 20 and/or server 40 may store the position of the battery module corresponding to the ID. A user can, based on the position data stored in the first master device 20 and/or server 40, more easily and accurately determine the position of the battery module 100-1. However, the present invention is not limited hereto, and the sensor 200-1 may make known its position by means of outputting a light, sound or the like. The operation of the sensor 200-1 will be explained in further detail with reference to FIG. 4.

Based on whether or not the sensor 200-1 which is 1:1-matched with the battery module 100-1 is operating normally, the user and/or server 40 can judge whether or not a battery module 100-1 sorted out as a suspect battery module is a defective battery module.

Figure 2:
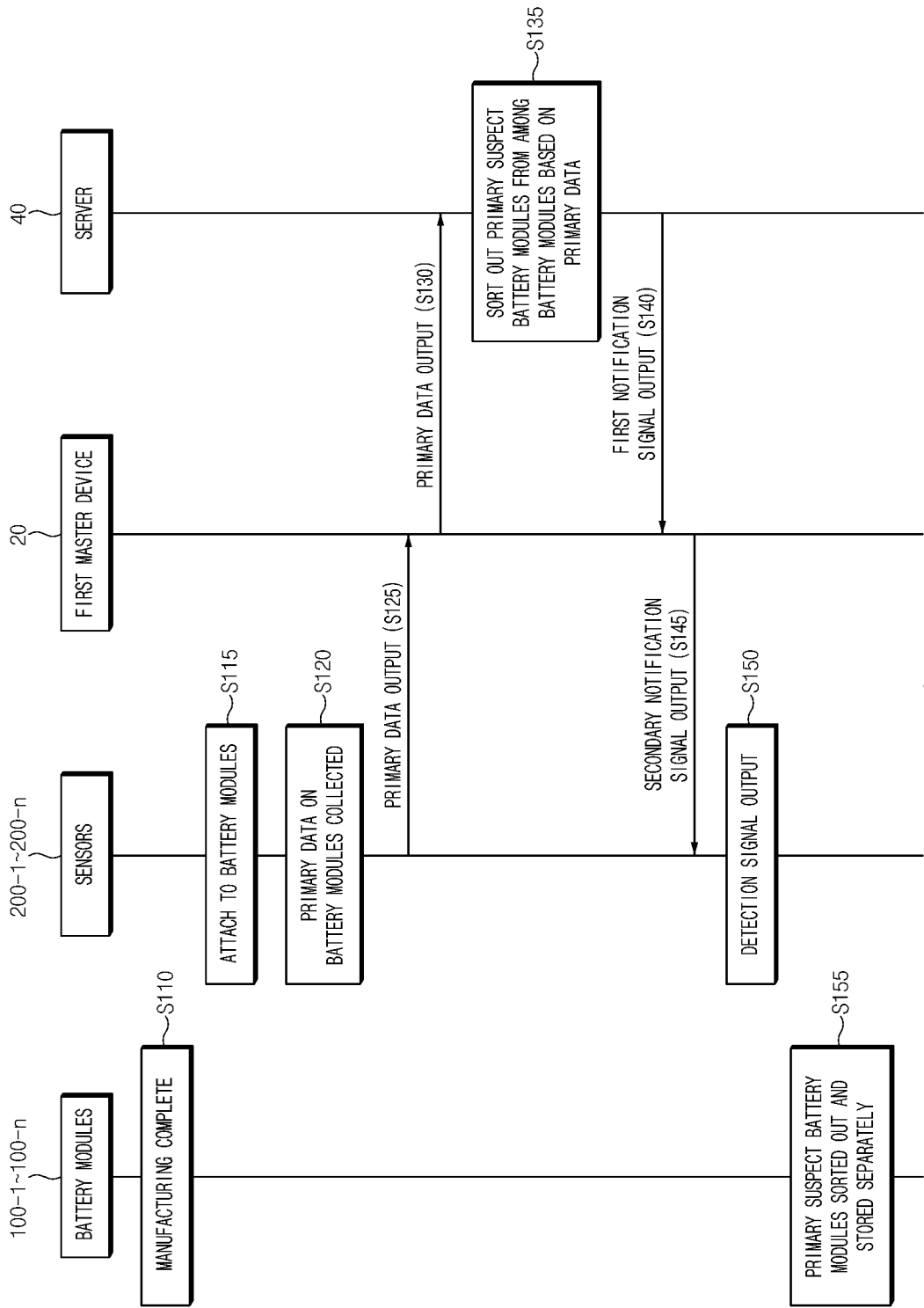
FIG. 2 is a flow chart for explaining the method by which the system for detecting a defective battery of FIG. 1 detects a defective battery module.
Figure 3:
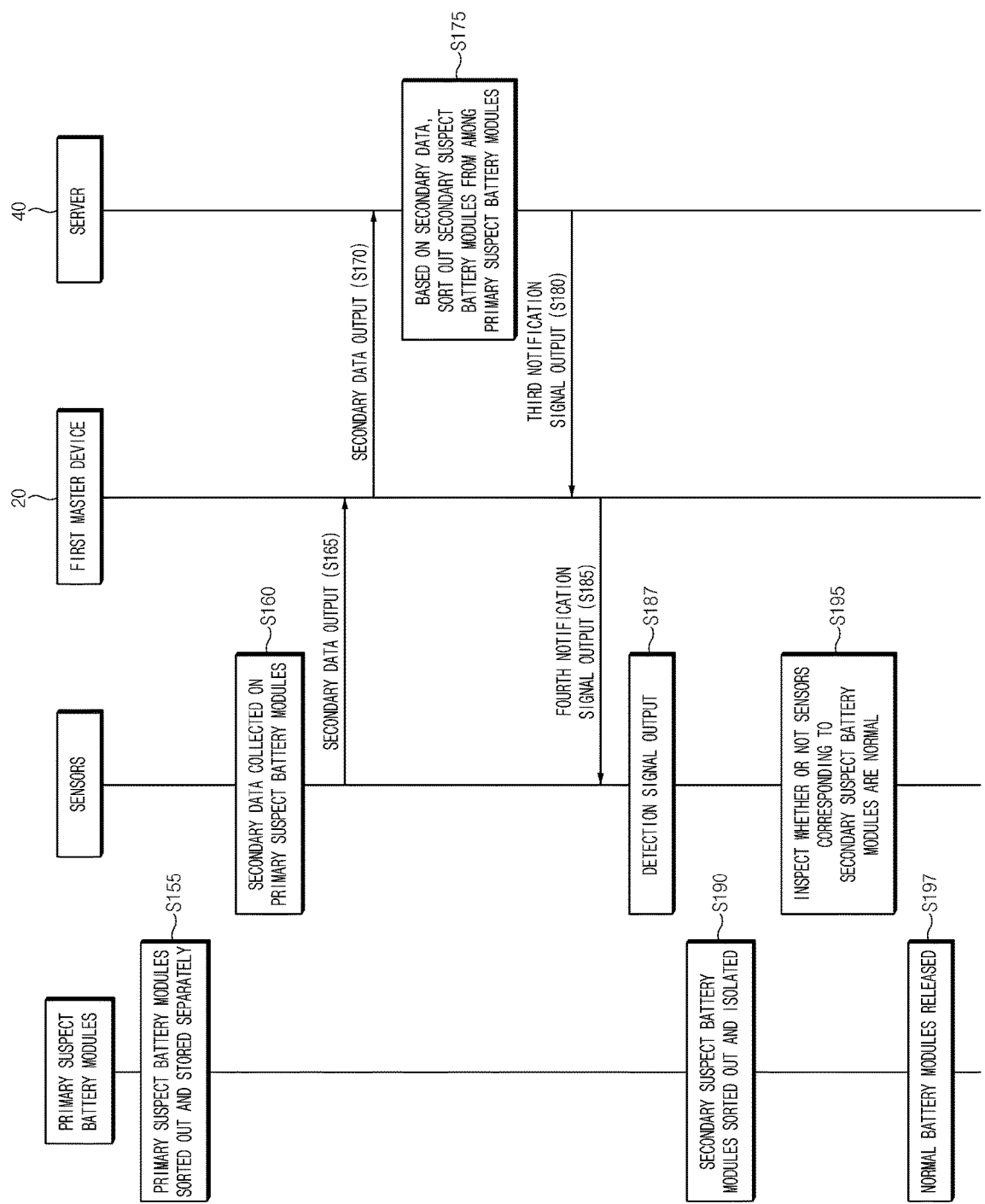
FIG. 3 is a flow chart for explaining the method by which the system for detecting a defective battery of FIG. 1 detects a defective battery module.

FIG. 2 and FIG. 3 are flow charts for explaining the method by which the system for detecting a defective battery 1 of FIG. 1 detects a defective battery module.

Referring to FIG. 2 and FIG. 3, the system for detecting a defective battery 1 may sort out primary suspect battery modules from among the battery modules 100-1~100-n, then sort out secondary suspect battery modules from among the primary suspect battery modules. The system for detecting a defective battery 1 may inspect whether or not the sensors attached to the secondary suspect battery modules are operating normally, then perform final sorting out of defective battery modules.

With reference to FIG. 2, a method by which the system for detecting a defective battery 1 sorts out primary suspect battery modules will be described. With reference to FIG. 3, a method by which the system for detecting a defective battery 1 sorts out secondary suspect battery modules will be described. Referring to FIG. 2 and FIG. 3, a method by which the system for detecting a defective battery 1 sorts out final defective battery modules after two sorting steps is described, however the present invention is not limited hereto. The system for detecting a defective battery 1 may sort of final defective battery modules after at least one sorting step. Further, whereas, with reference to FIG. 2 and FIG. 3, only an operation of carrying out inspection of battery modules 100-1~100-n is described, the present invention is not limited hereto. The system for detecting a defective battery 1 may, using the server 40, carry out inspection not only of battery modules 100-1~100-n but also of battery modules 100a-1~100a-m.

The manufacture of battery modules 100-1~100-n may be completed at Step S110. After being manufactured, the battery modules 100-1~100-n may be stored on a pallet.

In Step S115, the sensors 200-1~200-n may be attached to their respective battery modules 100-1~100-n.

In Step S120, the sensors 200-1~200-n may collect primary data on the battery modules 100-1~100-n to which they are attached. The primary data may include information on the voltages of the battery modules 100-1~100-n.

In Step S125, the sensors 200-1~200-n may output the collected primary data to a first master device 20.

In Step S130, the first master device 30 may output the primary data received from the sensors 200-1~200-n to a server 40.

In Step S135, the server 40 may, based on the primary data, sort out primary suspect battery modules from among the battery modules 100-1~100-n.

In Step S140, the server 40 may output to the first master device 20 a first notification signal including information on the primary suspect battery modules.

In Step S145, based on the information included in the first notification signal, the first master device 20 may output a second notification signal to the sensors which correspond to the primary suspect battery modules among the sensors 200-1~200-n.

In Step S150, the sensors having received the second notification signal may switch their operating mode to alarm mode. In alarm mode, the sensors may output a detection signal. A user and/or the first master device 20 may, based on the detection signals, determine the positions of the primary suspect battery modules.

In Step S155, a user may sort out the primary suspect battery modules and store them separately.

Step S160 through Step S197 are described with reference to FIG. 3. Step S160 through Step S197 are steps carried out on the primary suspect battery modules. In the descriptions making reference to FIG. 3, "sensors" refers to the sensors attached to the primary suspect battery modules.

In Step S160, the sensors may collect secondary data on the primary suspect battery modules. The secondary data may include information on the voltages of the primary suspect battery modules.

In Step S165, the sensors may output the collected secondary data to the first master device 20.

In Step S170, the first master device 20 may output the secondary data received from the sensors to the server 40.

In Step S175, the server 40 may, based on the secondary data, sort out secondary suspect battery modules from among the primary battery modules.

In Step S180, the server 40 may output to the first master device 20 a third notification signal including information on the secondary suspect battery modules.

In Step S185, based on the information included in the third notification signal, the first master device 20 may output a fourth notification signal to the sensors which correspond to the secondary suspect battery modules among the sensors.

In Step S187, the sensors having received the fourth notification signal may switch their operating mode to alarm mode. In alarm mode, the sensors may output a detection signal. A user and/or the first master device 20 may, based on the detection signals, determine the positions of the secondary suspect battery modules.

In Step S190, a user may sort out and isolate the secondary suspect battery modules.

In Step S195, whether or not the sensors corresponding to the secondary suspect battery modules are normal may be inspected. The inspection may be carried out by the first master device 20 and/or a user, or may be carried out by the sensors themselves. The secondary suspect battery modules corresponding to the sensors found to be normal may be finally identified as defective battery modules. Inspection may be repeated for the secondary suspect battery modules which correspond to the sensors found to be abnormal. Depending on the result of inspection, whether or not a secondary suspect battery module is defective may be decided.

In Step S197, the battery modules found to be normal may be released. The battery modules found to be defective may be discarded.

Figure 4:
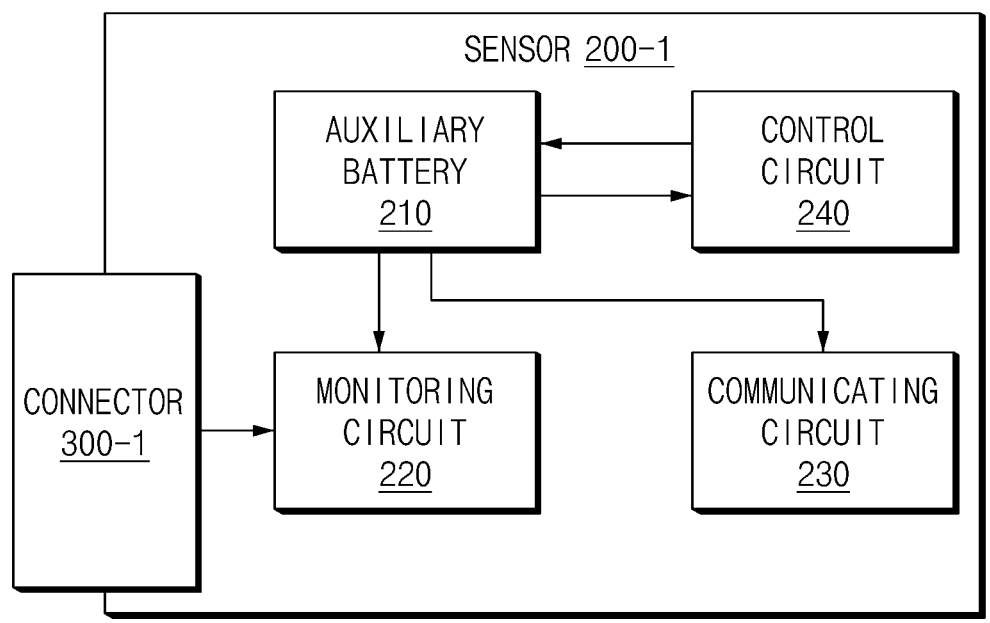
FIG. 4 is a block diagram illustrating the elements of the sensor of FIG. 1.

FIG. 4 is a block diagram illustrating the elements of the sensor 200-1 of FIG. 1.

The sensor 200-1 may be comprised of an auxiliary battery 210, a monitoring circuit 220, a communicating circuit 230 and a control circuit 240. Whereas not illustrated in FIG. 1, the sensor 200-1 may be connected to the battery module 100-1 of FIG. 1 through a connector (300-1).

The elements 220, 230, 240 of the sensor 200-1 may be supplied driving power from the auxiliary battery 210. The elements 220, 230, 240 of the sensor 200-1 may operate based on the driving power supplied from the auxiliary battery 210.

The control circuit 240 may, depending on the operating mode of the sensor 200-1, turn-on or turn-off the monitoring circuit 220 and/or communicating circuit 230. The control circuit 240 may, to turn-on or turn-off the monitoring circuit 220 and/or communicating circuit 230, control the auxiliary battery 210 or control a switch between the monitoring circuit 220 and communicating circuit 230 and the auxiliary battery 210. By the control circuit 240, the power input into the monitoring circuit 220 and/or the communicating circuit 230 may be cut off, or the switch may be turned off. Further, by the control circuit 240, power maybe supplied to the monitoring circuit 220 and/or the communicating circuit 230, or the switch may be turned on.

Prior to using a sensor 200-1, a user may reset the sensor 200-1. Immediately after being reset, the monitoring circuit 220 and the communicating circuit 230 may be in a turned-on state. In a case where the operating mode of the sensor 200-1 is switched to monitoring mode, the control circuit 240 may turn off the communicating circuit 230. In monitoring mode, the monitoring circuit 220 may collect data on the battery module 100-1 through the connector 300-1. The sensor 200-1 may store the collected data in a memory (not illustrated).

After a preset time has passed, the sensor 200-1 may switch operating mode from monitoring mode to communicating mode. "Preset time" refers to a time preset by a user to allow for sufficient data on the battery module 100-1 to be collected. In a case where the operating mode of the sensor 200-1 is switched to communicating mode, the control circuit 240 may turn on the communicating circuit 230, and turn off the monitoring circuit 220. The communicating circuit 230 may receive data on the battery module 100-1 from the monitoring circuit 220 or memory. The communicating circuit 230 may output data on the battery module 100-1 to the first master device 20.

In a case where a notification signal is not received from the first master device 20 after data on the battery module 100-1 has been output, the sensor 200-1 may once again operate in monitoring mode. In this case, the control circuit 240 may turn off the communicating circuit 230, and turn on the monitoring circuit 220.

In a case where a notification signal is received from the first master device 20 after data on the battery module 100-1 has been output, the sensor 200-1 may operate in alarm mode. In alarm mode, the communicating circuit 230 may output a detection signal. The sensor 200-1 may, to make known its position, output not only a detection signal but also a light and/or sound. The sensor 200-1 may output sound through an audio apparatus (not illustrated). Further, the sensor 200-1 may output a light through a light-emitting apparatus (not illustrated) such as an LED (Light Emitting Diode). After the detection signal has been output, the sensor 200-1 may once again operate in monitoring mode.

Figure 5:
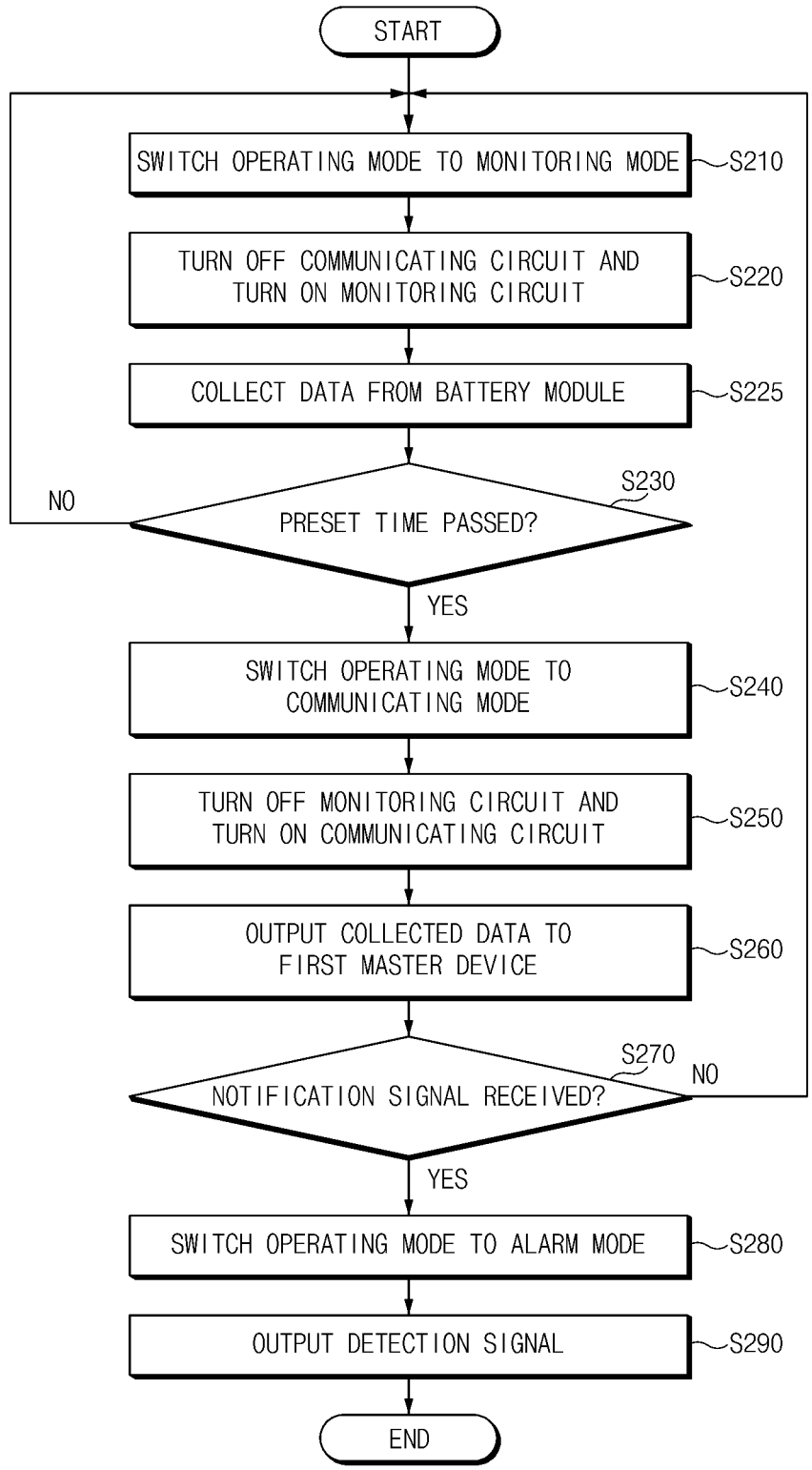
FIG. 5 is a flow chart illustrating the operation of the sensor of FIG. 1.

FIG. 5 is a flow chart illustrating the operation of the sensor 200-1 of FIG. 1.

Referring to FIG. 5, the sensor 200-1 is assumed to be operating in communicating mode or in alarm mode before step S210.

In Step S210, the sensor 200-1 may switch operating mode to monitoring mode.

In Step S220, the sensor 200-1 may turn off the communicating circuit 230, and turn on the monitoring circuit 220.

In Step S225, the sensor 200-1 may collect data from the battery module 100-1.

In Step S230, the sensor 200-1 may determine whether or not the preset time has passed.

If the preset time has not passed, step S210 is carried out again.

If the preset time has passed, then step S240 is carried out. In Step S240, the sensor 200-1 may switch from monitoring mode to communicating mode.

In Step S250, the sensor 200-1 may turn on the communicating circuit 230, and turn off the monitoring circuit 220.

In Step S260, the sensor 200-1 may output the collected data to the first master device 20.

In Step S270, the sensor 200-1 may decide its operating mode depending on whether or not an alarm signal is received from the first master device 20.

If an alarm signal is not received, step S210 is carried out again.

If an alarm signal is received, then step S280 is carried out. In step S280, the sensor 200-1 may switch the operating mode to alarm mode.

In step S290, the sensor 200-1 may output a detection signal.

Figure 6:
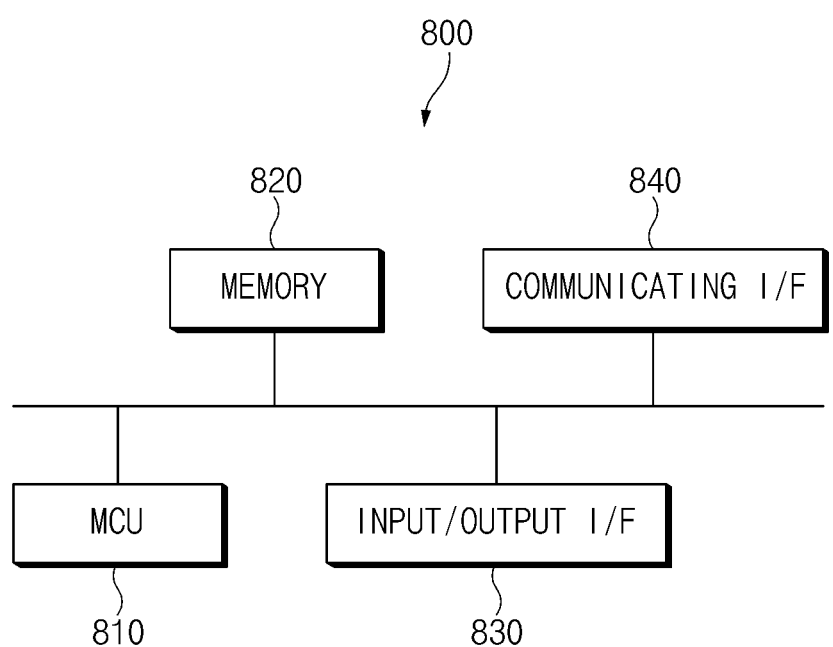
FIG. 6 is a drawing illustrating the hardware configuration of an apparatus for diagnosing a battery according to one embodiment of the present invention.

FIG. 6 is a drawing illustrating the hardware configuration of an apparatus for diagnosing a battery according to one embodiment of the present invention.

Referring to FIG. 6, apparatus for diagnosing a battery 800 may be comprised of a microcontroller unit (MCU; 810) which controls various processing and the respective elements; a memory 820 on which an operating system program and various other programs (for example, a battery diagnostics program, a voltage approximation formula generating program, etc.) are recorded; an input/output interface 830 which provides an input interface and output interface with the battery cell modules and/or semiconductor switching element; and a communicating interface 840 which is capable of external communication through wired or wireless communication networks. In this manner, the computer program according to the present invention, by being recorded on a memory 820 and being processed by a microcontroller 810, can be implemented in the form of modules which carry out, for example, the respective functional blocks illustrated in FIG. 2.

Specific embodiments for carrying out the present invention have been described in the foregoing. The present invention includes not only the above-described embodiments, but also other embodiments which can be readily arrived at through simple design modifications. Further, the present invention also includes art which can be readily carried out in a modified form using the embodiments. Therefore, the scope of the present invention shall not be limited to the embodiments described above, and shall be defined not only by the appended claims but also their equivalents.

The invention claimed is:

1. A system for detecting a defective battery, the system comprising:
 a plurality of first sensors, each first sensor configured to monitor a corresponding one of a plurality first battery modules; and
 a first master device configured to communicate with the plurality of first sensors,
 wherein each first sensor comprises:
 a monitoring circuit configured to collect primary data from the corresponding first battery module in a monitoring mode; and
 a communicating circuit configured to output the primary data to the first master device in a communicating mode, and
 wherein the monitoring circuit is turned off in the communicating mode,
 and the communicating circuit is turned off in the monitoring mode.

2. The system of claim 1, wherein:
 the plurality of first sensors are attached to their respective first battery modules, and
 the first master device is attached to a first pallet which includes the plurality of first battery modules.

3. The system of claim 1, wherein:
 each first sensor further includes a first control circuit configured to turn on the monitoring circuit and turn off the communicating circuit in the monitoring mode, and turn off the monitoring circuit and turn on the communicating circuit in the communicating mode.

4. The system of claim 1, wherein:
 the first master device is configured to control the plurality of first sensors so that the monitoring circuits of the respective first sensors are turned on and the communicating circuits of the respective first sensors are turned off in the monitoring mode, and so that the monitoring circuits of the respective first sensors are turned off and the communicating circuits of the respective first sensors are turned on in the communicating mode.

5. The system of claim 1, wherein:
 each first sensor further includes an auxiliary battery for supplying a driving power to the monitoring circuit and the communicating circuit.

6. The system of claim 1, further comprising:
 a plurality of second sensors, each secondary sensor configured to collect secondary data from a corresponding one of a plurality of second battery modules;
 a second master device configured to communicate with the plurality of second sensors to receive the secondary data; and
 a server configured to identify defective battery modules from among the first battery modules and the second battery modules based on the collected primary data and the collected secondary data,
 wherein the first battery modules and the second battery modules are respectively stored on different pallets.

7. The system of claim 6, wherein:
 the primary data indicates an open circuit voltage of the first battery modules;
 the secondary data indicates the open circuit voltage of the second battery modules; and
 wherein the server is configured to identify defective battery modules based on the open circuit voltage being lower than a reference voltage.

8. The system of claim 6, wherein:
 the server is configured to output a first notification signal to the first master device in response to the defective battery module being identified among the first battery modules;
 the first master device is configured to output a second notification signal to the first sensor corresponding to the defective battery module based on the first notification signal; and
 the first sensor corresponding to the defective battery module is configured to switch an operating mode to an alarm mode based on the second notification signal.

9. The system of claim 8, wherein:
 the first sensor corresponding to the defective battery module is configured to output a detection signal which includes position data of the defective battery module in the alarm mode.

10. The system of claim 9, wherein:
 the detection signal includes an identification of the defective battery module.

11. A method for detecting a defective battery, the method comprised of:
- collecting, by a plurality of first monitoring circuits of first sensors, primary data from each of a plurality of first battery modules corresponding to the first sensors in a one-to-one correspondence;
- collecting, by a plurality of second monitoring circuits of second sensors, secondary data from each of a plurality of second battery modules corresponding to the second sensors in a one-to-one correspondence;
- outputting, by a first master device in communication with first communicating circuits of the first sensors, the primary data to a server;
- outputting, by a second master device in communication with second communicating circuits of the second sensors, the secondary data to the server; and
- identifying, by the server, one or more suspect battery modules suspected to be defective from among the first battery modules and the second battery modules based on the primary data and the secondary data, wherein:
- during the collecting, a driving power input into the respective first communicating circuits and the second communicating circuits is cut off; and
- during the outputting, the driving power input into the respective first monitoring circuits and the second monitoring circuits is cut off.

12. The method of claim 11, further comprising:
- outputting a notification signal to the sensors corresponding to a suspect battery module; and
- outputting, by the sensor corresponding to suspect battery module, a detection signal based on the notification signal, wherein:
- the detection signal includes an identification of the sensor corresponding to the suspect battery module.

13. The method of claim 12, comprising:
- determining the location of the sensor corresponding to the suspect battery module based on the detection signal;
- detaching the sensor corresponding to the suspect battery module; and
- inspecting whether or not the sensor is defective, wherein:
- in response to the sensor not being defective, determining that the suspect battery module is defective, and
- in response to the sensor being defective, performing inspection of the suspect battery module again.

* * * * *